(12) United States Patent
Fournel et al.

(10) Patent No.: US 6,754,125 B2
(45) Date of Patent: Jun. 22, 2004

(54) METHOD AND DEVICE FOR REFRESHING REFERENCE CELLS

(75) Inventors: Richard Fournel, Lumbin (FR); Leïla Sedjai Aitouarab, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 185 days.

(21) Appl. No.: 10/062,271

(22) Filed: Feb. 1, 2002

(65) Prior Publication Data

US 2002/0159308 A1 Oct. 31, 2002

(30) Foreign Application Priority Data

Feb. 2, 2001 (FR) .............................. 01 01440

(51) Int. Cl.$^7$ ................................................ G11C 7/00
(52) U.S. Cl. .................. 365/222; 365/149; 365/189.07; 365/203
(58) Field of Search ....................... 365/185.01, 189.01, 365/189.07, 149, 203, 207, 222

(56) References Cited

U.S. PATENT DOCUMENTS

| | | | |
|---|---|---|---|
| 5,539,690 A | * 7/1996 | Talreja et al. .......... | 365/185.22 |
| 5,580,988 A | * 12/1996 | Dave ..................... | 548/953 |
| 5,852,582 A | 12/1998 | Cleveland et al. .......... | 365/222 |
| 5,886,927 A | 3/1999 | Takeuchi ................ | 365/185.22 |
| 6,108,241 A | 8/2000 | Chevallier ............. | 365/185.33 |
| 6,452,852 B2 | * 9/2002 | Bohm et al. ................. | 365/222 |
| 6,515,930 B2 | * 2/2003 | Jacquet et al. .............. | 365/222 |
| 2001/0026491 A1 | * 10/2001 | Bohm et al. ................. | 365/222 |
| 2002/0145911 A1 | * 10/2002 | Maayan et al. ......... | 365/185.22 |
| 2002/0159321 A1 | * 10/2002 | Jacquet et al. .............. | 365/222 |
| 2002/0181284 A1 | * 12/2002 | Kato ...................... | 365/185.21 |

FOREIGN PATENT DOCUMENTS

| | | | |
|---|---|---|---|
| EP | 0753869 | 1/1997 | ........... G11C/16/06 |
| EP | 0987715 | 3/2000 | ........... G11C/11/56 |
| WO | 90/12400 | 10/1990 | ............. G11C/7/00 |

* cited by examiner

*Primary Examiner*—Viet Q. Nguyen
(74) *Attorney, Agent, or Firm*—Lisa K. Jorgenson; Allen, Dyer, Doppelt, Milbrath & Gilchrist, P.A.

(57) ABSTRACT

Reference cells are refreshed in a non-volatile memory that includes a plurality of memory cells. A selected reference cell and a non-used memory cell are read simultaneously, and a signal read from the reference cell is compared to a signal read from the non-used memory cell. A refresh signal for refreshing the reference cell is supplied when the signal read therefrom is less than the signal read from the non-used memory cell.

22 Claims, 4 Drawing Sheets

METHOD AND DEVICE FOR REFRESHING REFERENCE CELLS

FIELD OF THE INVENTION

The invention relates to integrated circuit memories, and more particularly, to non-volatile type memories known under the acronyms EPROM for Electrically Programmable Read Only Memory, EEPROM for Electrically Erasable and Programmable Read Only Memory, and FLASH for a memory which is erasable in groups of memory cells. In such non-volatile memories, the invention relates to a method and device for checking the electrical state of reference cells used for reading, and for refreshing their electrical state as required.

BACKGROUND OF THE INVENTION

A non-volatile type memory comprises a plurality of memory cells (FIG. 1) $CE_{11}$, $CE_{12}$, $CE_{13}$, $CE_{21}$, $CE_{22}$ and $CE_{23}$ which are arranged at the intersections of lines L1, L2 and columns C1, C2, C3. Each memory cell CE comprises an insulated gate MOSFET transistor having a drain D connected to a column, and a source S connected to ground and a gate G connected to a line. To erase the memory cell, the source S is connected to a high voltage, such as 12 volts, for example.

Information is stored based upon an electrical charge stored under the gate G. This charge is formed by electrons or holes. The storage of these charges is obtained by applying appropriate voltages on the electrodes D, S and G of each cell using circuits not shown in FIG. 1. The memory cell therefore exhibits two states: one without an electrical charge and the other with an electrical charge. The states respectively correspond, by convention, to a binary 1 and a binary 0.

Readout of the memory cells is achieved by applying other appropriate voltages on the electrodes D, S and G of each cell such that the signal supplied by a charged cell on the column is different from that supplied by a non-charged cell. By comparing the readout signal with that supplied by a reference cell, with the reference cell corresponding to a non-charged cell, a determination can be made as to whether the read memory cell is charged or not.

More specifically, the drain/source current Id (FIG. 2) of a memory cell varies as a function of the voltage VG applied to the gate G according to curve EFFA in the erased state (without charge), and according to curve PROG in the programmed state (charged). Curve A shown in dotted lines belongs to the reference cell and corresponds to a non-charged memory cell, but whose output signal is applied to an amplifier whose gain is less than one.

Figure 2:
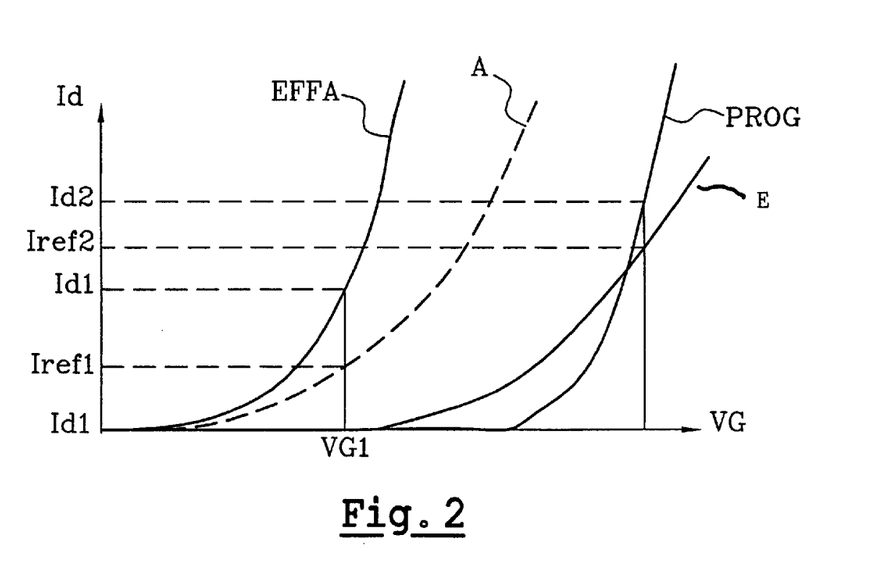
FIG. 2 is a diagram of curves characterizing the states of memory cells and reference cells according to the present invention.

During a readout operation, a gate voltage VG1 is applied, which is between the two curves EFFA and PROG, and a measurement is made of the current Id1 of cell CE and the current Iref of the reference cell. If Id1 is less than Iref1, the memory cell is in the charged or programmed state (curve PROG). If Id1 is greater than Iref1, the memory cell is in the non-charged or erased state (curve EFFA).

The reference cells are produced in the form of an additional column REF of the memory such that a reference cell is called upon at each readout of a memory cell of the line. As a result of being called upon, the reference cell has a tendency to be charged each time, which causes its characteristic curve to become displaced towards the PROG curve. When this displacement is too great (curve E), a readout error results since the charged cell supplies a current Id2 greater than the current Iref2. This results in the cell being considered in the erased state, whereas the cell is actually in the programmed state. This error can appear after a short or long period of time depending on the characteristics of the reference cell, and the number of times the latter is called upon.

SUMMARY OF THE INVENTION

In view of the foregoing background, an object of the present invention is to avoid readout errors in a non-volatile memory due to a change in characteristics or a drift in the reference cell.

This and other objects, advantages and features according to the present invention are achieved by refreshing the electrical state of first degree reference cells when their drift exceeds a certain threshold determined by one or more other reference cells (second degree reference cells). The second degree reference cells can also be refreshed when their drift exceeds another threshold determined by one or more reference cells (third degree reference cells).

A device for refreshing at least one reference memory cell according to the invention is implemented in a recurrent manner, for example, at regular time intervals such as every year, or after a certain number of memory readout operations. The refresh of the reference cells can be achieved in different ways, either by their erasure or by a shift in their characteristic curve, or by a modification in the gain of the readout amplifier.

The invention also relates to a method of refreshing at least one reference memory cell in a non-volatile memory. The reference cell exhibits a characteristic curve which corresponds to a characteristic curve of an erased memory cell, but is shifted towards the characteristic curve of a programmed memory cell.

The method comprises the following steps:
(a) selecting at least a first non-used memory cell as a checking cell, and positioning its characteristic curve between that of the reference cell and that of a programmed cell;
(b) simultaneously reading a reference cell and the checking cell;
(c) comparing the signals read in step (b); and
(d) supplying a refresh signal for refreshing the selected reference cell when the signal read on the latter is less than the signal read on the checking cell.

When several reference cells are to be refreshed, step (d) is followed by the following step:
(e) returning to step (b) for another reference cell.

The refresh signal effects the characteristic curve of the reference cell in different ways: by erasing it, by performing a voltage shift in the reference cell, or by modifying the gain of the readout amplifier for the selected reference cell.

The device for refreshing at least one reference memory cell in a non-volatile memory includes a reference cell exhibiting a characteristic curve which corresponds to a characteristic curve of an erased memory cell, but is shifted towards the characteristic curve of a programmed memory cell. The device comprises means for selecting a non-used memory cell as a checking cell, and positioning the latter according to a characteristic curve arranged between that of the reference cell and that of a programmed cell. There are also means for simultaneously reading a reference cell and the checking cell.

The device further comprises means for comparing the signals read on the reference cell and on the checking cell, and supplying a refresh signal for refreshing the reference cell when the signal read on the reference cell is less than the signal read on the checking cell. There are means for modifying, in the presence of the refresh signal, the characteristic curve of the reference cell to return it substantially to its initial state.

BRIEF DESCRIPTION OF THE DRAWINGS

Other characteristics and advantages of the present invention shall become more apparent from reading the following description of specific embodiments in conjunction with the appended drawings, in which.

DETAILED DESCRIPTION OF THE PREFERRED EMBODIMENTS

Figure 1:
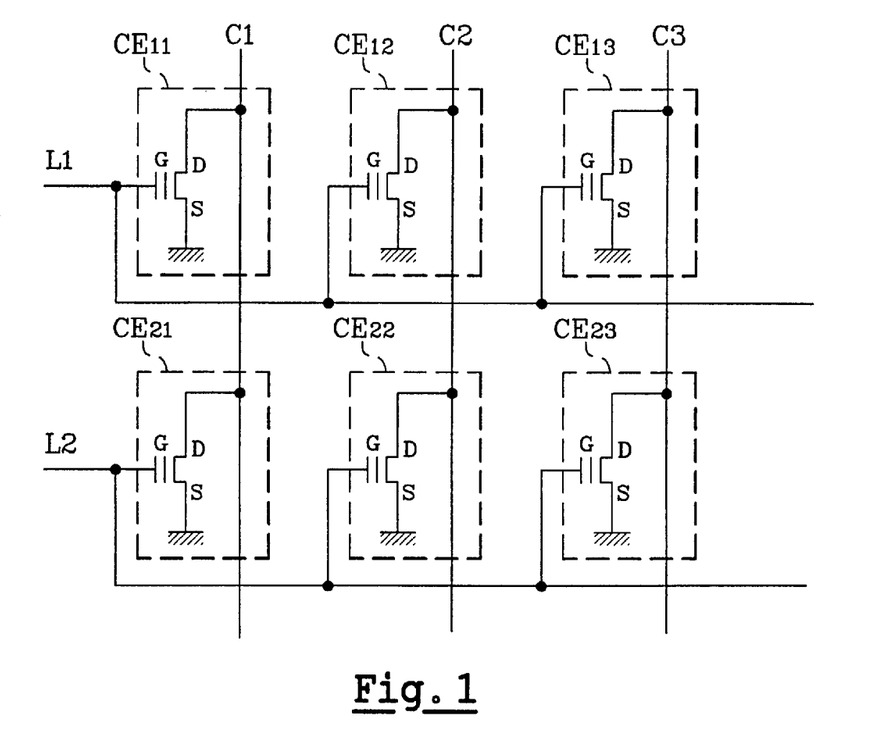
FIG. 1 is a diagram of a portion of a non-volatile memory to which the present invention is applicable.

A non-volatile memory 10 to which the invention is applicable comprises n*r memory cells CE, each arranged at an intersection of a line L1 to Ln and a column C1 to Cr according to the diagram of FIG. 1. A memory cell is selected by selecting a line or row via addressing circuit 12, and selecting a column via addressing circuit 14. The selection voltages are supplied by power supply circuits 16 and 18, and have the appropriate values to perform the disclosed operation, such as recording or reading a binary digit.

Operations performed on the memory are controlled by a control circuit 24, such as a microprocessor or microcontroller. In addition to the r columns, the memory comprises at least one supplementary column REF comprising n reference cells Cref, from Cref1 to Crefn, one per line, serving as a reference during readout.

The device according to the invention comprises at least one supplementary memory cell Cveri which serves as reference for the reference memory cells Cref to determine the drift of the latter relative to their initial state. To serve as a reference, memory cell Cveri must be set to the same initial state as a readout reference cell, i.e., in the erased state (curve EFFA).

Moreover, the characteristic curve (FIG. 2) must be shifted towards the one corresponding to the programmed state beyond curve A. This is done either by an appropriate choice of gain for the readout amplifier to obtain a curve VERI1$g$ located between curve A and curve PROG (FIG. 4), or by shifting the base or zero point of the curve, without changing its slope, to obtain a curve VERI1$d$ located between a curve A' of the readout reference cell and curve PROG (FIG. 5).

Figure 4:
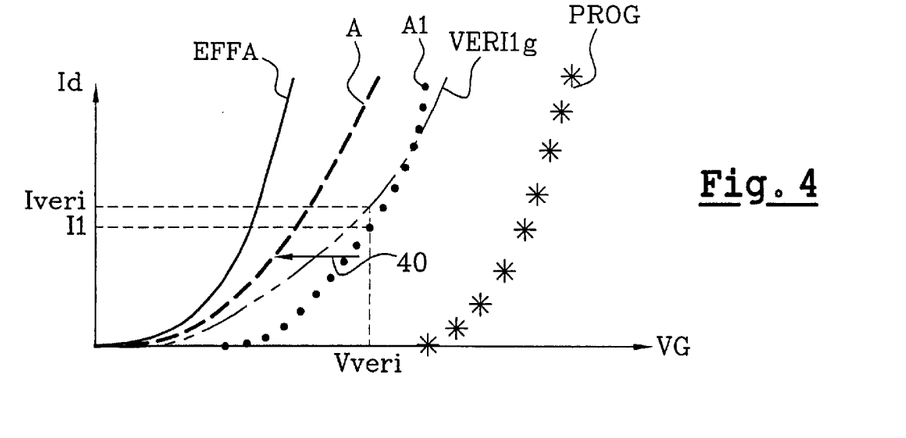
FIG. 4 is a diagram of curves characterizing the states of erased, programmed, reference and checking cells for a readout device with the gain of the signal read on the reference cell and on the checking cell being modified, and with the recalibration being achieved by erasure of the reference cell according to the present invention.
Figure 5:
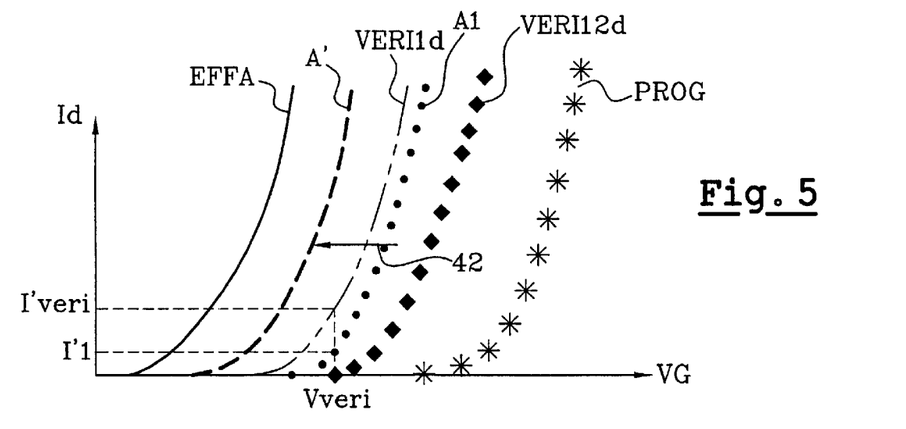
FIG. 5 is a diagram of curves characterizing the states of erased, programmed, reference and checking cells for a voltage shifting device according to the present invention.

In the case of FIG. 4, memory cell Cveri is an erased memory cell whose characteristic curve is modified by modifying the gain of the readout amplifier to obtain curve VERI1$g$ which corresponds to a gain of less than the one that is applied to the signal on the reference cell Cref. As the readout operations accumulate, the reference cell Cref builds up a charge and its characteristic curve A1 intersects curve VERI1$g$ of the checking cell.

It is then considered that the reference cell has drifted too far, and that it must be readjusted or repositioned. The invention provides for a readout of each reference cell Cref1 to Crefn, and a comparison of the read signal with the one read on the checking cell Cveri. The readouts are performed at gate voltage Vveri.

In the case of FIG. 4, if the current I1 of the reference cell is less than the current Iveri of the checking cell, it is determined that the reference cell has too much charge and that it must be erased for its characteristic curve to return to A. In the opposite case, the reference cell Cref is left as it is.

In the case of FIG. 5, if the current I'1 of the reference cell is less than the current I'veri of the checking cell, it is determined that the reference cell has too much charge. Its characteristic curve must be readjusted towards curve EFFA to be placed in the region of curve A'. This is done by applying a corrective readjusting (or repositioning) voltage. In the opposite case, the cell Cref is left as it is.

There is a third readjusting or recalibrating approach which is to change the gain of the readout amplifier, as shall be explained in connection with the curves of FIG. 6, which is similar to that of FIG. 4. After a certain period of time, the curve of the reference cell drifts towards curve PROG to become A1. This curve A1 corresponds to a certain gain of the readout amplifier which is, for example, half that of the memory cell. The proposed approach includes modifying the gain of the reference cell readout amplifier to make it equal to that of a readout cell. The curve A2 is obtained which corresponds to that of an erased memory cell, but shifted towards the right of FIG. 6.

The first two approaches described above are implemented by two devices, each comprising a detection circuit for detecting the drift of the reference cell, and a readjusting circuit for readjusting the reference cell. The detection circuit (FIGS. 3 and 7) comprises at least one memory cell Cveri which is selected to be read by a signal VERI applied to a column selection circuit 14. The signal read on the cell Cveri is applied to an input terminal Bref of a comparator 28 via an amplifier 26 veri.

The signal read on the readout reference cell by the address circuit 12 is applied to the other input terminal BC of the comparator 22 via an amplifier 26ref. Comparator 28 is formed by comparator 22 in the diagram of FIG. 3, and there is a switch 30 to direct the signals read on the memory cells to the appropriate input terminals.

Figure 3:
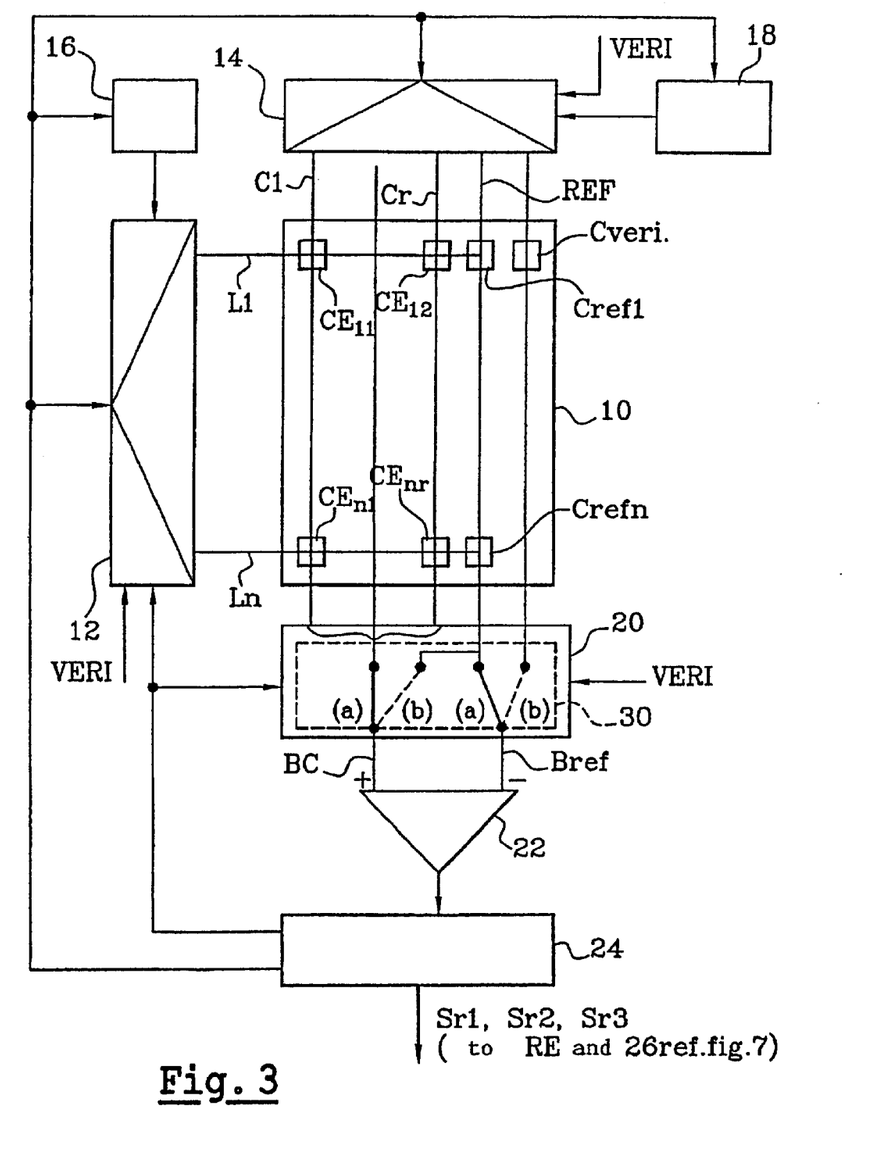
FIG. 3 is a diagram of a non-volatile memory implementing the device and method according to the present invention.

In the (a) position, input terminal BC is connected to the r columns while input terminal Bref is connected to the reference column REF. In the (b) position, input terminal BC is connected to column REF while the input terminal Bref is connected to cell Cveri.

The signal Sr1 (first approach) or Sr2 (second approach) on the output terminal of comparator 28 is applied to the reference cell selected via a readjusting circuit RE1 to REn. The output signal of the comparator 28 passes to a given state when I1 or I'1 is respectively less than Iveri and I'veri, which means that the drift has exceeded the threshold. The comparator remains in the other state in the opposite case.

In the first approach, circuit RE performs an erasure of the reference cell by applying the appropriate voltages on the drain, source and gate electrodes, such that the curve returns to A (FIG. 4, arrow 40). In the second approach, circuit RE performs a shift in the source voltage of the memory cell transistor, which displaces the characteristic curve towards the one corresponding to an erasure to return it to the region of A' (FIG. 5, arrow 42).

In the first approach, the function of circuit RE is preferably implemented via the microcontroller 24 that performs an erase operation. In the second approach, the source S of each reference cell is connected to a voltage source which produces the shift of curve A'. When this curve arrives at A'1, circuit RE short circuits the voltage source such that the curve returns to A' when the short circuit is removed.

Figure 6:
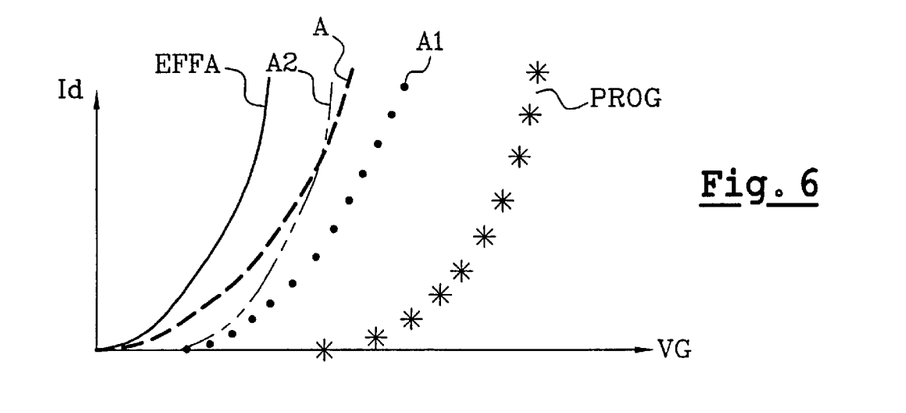
FIG. 6 is a diagram of curves characterizing the states of erased, programmed, reference and checking cells for a reference cell gain modification device according to the present invention.

In the third approach, there is no RE circuit per reference cell Cref, but the gain of the readout amplifier 26ref associated with the column REF is modified to pass from curve A1 to curve A2 (FIG. 6). The modification in gain is provided by obtaining unity gain instead of a gain less than unity for obtaining curve A (FIG. 6). This modification in gain only intervenes if all the reference cells Cref have drifted beyond the limit fixed by curve A1. Each reference cell Cref is tested and the gain of the amplifier 26ref is modified only if all the cells have drifted beyond the fixed limit.

The microcontroller 24 counts the reference cells which have drifted beyond the established limit. If the number obtained is equal to n, the gain of the amplifier 26ref is modified. In the opposite case, there is no modification.

Figure 7:
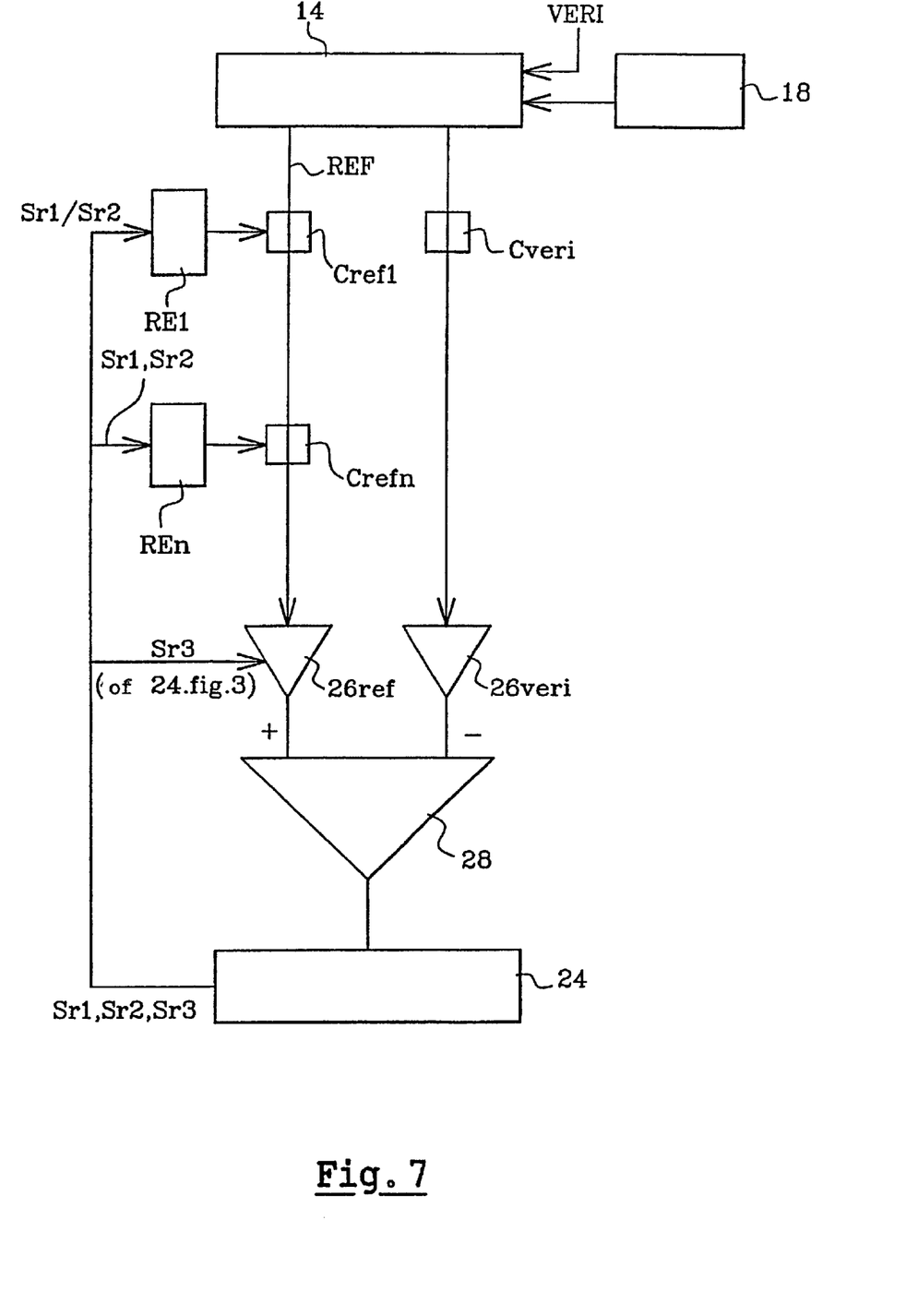
FIG. 7 is a simplified example of a specific embodiment of the device according to the present invention.

As a variation, the check is halted, and there is no gain modification as soon as a reference cell has not exceeded the established limit, without waiting for the check on the n reference cells. In FIGS. 3 and 7, this third approach is represented schematically by the signal Sr3 supplied by the microcontroller 24 of the diagram of FIG. 3, which is applied to the amplifier.

The refresh cycle for the reference cells Cref is initialized either at regular time intervals during the use of the memory 10, for example, once per year, or either after totaling a certain number of address cycles of the memory 10. This initialization is performed by the microcontroller 24 which comprises an internal clock for measuring time or a counter for counting the memory cycles.

The invention has been described using just one checking cell, but is also applicable to the use of several checking cells, for example, one per memory sector. The invention is also applicable for refreshing several checking cells using another checking cell for reference.

That which is claimed is:

1. A method for refreshing at least one reference cell in a non-volatile memory comprising a plurality of memory cells, the at least one reference cell having a characteristic curve corresponding to a characteristic curve of an erased memory cell but shifted towards a characteristic curve of a programmed memory cell, the method comprising:

selecting a first non-used memory cell from the plurality of memory cells, and positioning a characteristic curve thereof between the characteristic curve of the at least one reference cell and the characteristic curve of a programmed memory cell;

simultaneously reading the at least one reference cell and the first non-used memory cell;

comparing a signal read from the at least one reference cell to a signal read from the first non-used memory cell; and supplying a refresh signal for refreshing the at least one reference cell when the signal read therefrom is less than the signal read from the first non-used memory cell.

2. A method according to claim 1, wherein the at least one reference cell and each memory cell comprises a transistor comprising a gate, a source and a drain; and wherein each characteristic curve corresponds to a plot of a drain/source current of a respective transistor versus a gate voltage applied thereto.

3. A method according to claim 1, wherein the at least one reference cell comprises a second reference cell; the method further comprising refreshing the second reference cell by:

simultaneously reading the second reference cell and the first non-used memory cell;

comparing a signal read from the second reference cell to a signal read from the first non-used memory cell; and supplying a refresh signal for refreshing the second reference cell when the signal read therefrom is less than the signal read from the first non-used memory cell.

4. A method according to claim 1, wherein the refresh signal erases the at least one reference cell so that the characteristic curve thereof returns to an initial state.

5. A method according to claim 1, wherein the refresh signal applies a voltage to the at least one reference cell so that the characteristic curve thereof is shifted towards the characteristic curve of an erased memory cell.

6. A method according to claim 1, wherein the non-volatile memory further comprises a readout amplifier connected to the at least one reference cell; the method further comprising modifying a gain of the readout amplifier based upon the refresh signal being supplied thereto.

7. A method according to claim 6, wherein the at least one reference cell comprises a plurality of reference cells connected to the readout amplifier; and wherein the refresh signal is supplied to the readout amplifier if each signal read from the plurality of reference cells is less than the signal read from the first non-used memory cell.

8. A method according to claim 1, wherein the plurality of memory cells comprises a second non-used memory cell; the method further comprising refreshing the first non-used memory cell by:

selecting the second non-used memory cell, and positioning a characteristic curve thereof between the characteristic curve of the first non-used memory cell and the characteristic curve of a programmed memory cell;

simultaneously reading the first non-used memory cell and the second non-used memory cell;

comparing a signal read from the first non-used memory cell to a signal read from the second non-used memory cell; and supplying a refresh signal for refreshing the first non-used memory cell when the signal read therefrom is less than the signal read from the second non-used memory cell.

9. A method for refreshing at least one reference cell in a non-volatile memory comprising a plurality of memory cells, the at least one reference cell having a characteristic curve corresponding to a characteristic curve of an erased memory cell but shifted towards a characteristic curve of a programmed memory cell, the method comprising:

selecting a first non-used memory cell from the plurality of memory cells, and positioning a characteristic curve thereof between the characteristic curve of the at least one reference cell and the characteristic curve of a programmed memory cell;

simultaneously reading the at least one reference cell and the first non-used memory cell;

comparing a signal read from the at least one reference cell to a signal read from the first non-used memory cell; and supplying a refresh signal for refreshing the at least one reference cell when the signal read therefrom is less than the signal read from the first non-used memory cell, the refresh signal for modifying the characteristic curve of the at least one reference cell.

10. A method according to claim 9, wherein the at least one reference cell and each memory cell comprises a transistor comprising a gate, a source and a drain; and wherein each characteristic curve corresponds to a plot of a drain/source current of a respective transistor versus a gate voltage applied thereto.

11. A method according to claim 9, wherein the at least one reference cell comprises a second reference cell; the method further comprising refreshing the second reference cell by:

simultaneously reading the second reference cell and the first non-used memory cell;

comparing a signal read from the second reference cell to a signal read from the first non-used memory cell; and supplying a refresh signal for refreshing the second reference cell when the signal read therefrom is less than the signal read from the first non-used memory cell, the refresh signal for modifying a characteristic curve of the second reference cell.

12. A method according to claim 9, wherein the refresh signal erases the at least one reference cell so that the characteristic curve thereof returns to an initial state.

13. A method according to claim 9, wherein the refresh signal applies a voltage to the at least one reference cell so that the characteristic curve thereof is shifted towards the characteristic curve of an erased memory cell.

14. A method according to claim 9, wherein the non-volatile memory further comprises a readout amplifier connected to the at least one reference cell; the method further comprising modifying a gain of the readout amplifier based upon the refresh signal being supplied thereto.

15. A method according to claim 14, wherein the at least one reference cell comprises a plurality of reference cells connected to the readout amplifier; and wherein the refresh signal is supplied to the readout amplifier if each signal read from the plurality of reference cells is less than the signal read from the first non-used memory cell.

16. A method according to claim 9, wherein the plurality of memory cells comprises a second non-used memory cell; the method further comprising refreshing the first non-used memory cell by:

selecting the second non-used memory cell, and positioning a characteristic curve thereof between the characteristic curve of the first non-used memory cell and the characteristic curve of a programmed memory cell;

simultaneously reading the first non-used memory cell and the second non-used memory cell;

comparing a signal read from the first non-used memory cell to a signal read from the second non-used memory cell; and supplying a refresh signal for refreshing the first non-used memory cell when the signal read therefrom is less than the signal read from the second non-used memory cell, the refresh signal for modifying the characteristic curve of the first non-used reference cell.

17. A non-volatile memory comprising:

a plurality of memory cells comprising
at least one reference cell having a characteristic curve corresponding to a characteristic curve of an erased memory cell but shifted towards a characteristic curve of a programmed memory cell, and
a first non-used memory cell having a characteristic curve between the characteristic curve of said at least one reference cell and the characteristic curve of a programmed memory cell;

a switching circuit connected to said plurality of memory cells for simultaneously selecting said at least one reference cell and said first non-used memory cell;

a comparison circuit connected to said switching circuit for comparing a signal read from said at least one reference cell and a signal read from said first non-used memory cell; and a control circuit for supplying a refresh signal to said at least one reference cell for modifying the characteristic curve thereof, the refresh signal being supplied when a signal read from said at least one reference cell is less than a signal read from said first non-used memory cell.

18. A non-volatile memory according to claim 17, wherein said at least one reference cell and each memory cell comprises a transistor comprising a gate, a source and a drain; and wherein each characteristic curve corresponds to a plot of a drain/source current of a respective transistor versus a gate voltage applied thereto.

19. A non-volatile memory according to claim 17, further comprising a readjusting circuit connected to said at least one reference cell, said readjusting circuit for erasing said at least one reference cell based upon the refreshing signal for returning the characteristic curve thereof to an initial state.

20. A non-volatile memory according to claim 17, further comprising a readjusting circuit connected to said at least one reference cell, said readjusting circuit for applying a voltage to said at least one reference cell based upon the refreshing signal for shifting the characteristic curve thereof towards the characteristic curve of an erased memory cell.

21. A non-volatile memory according to claim 17, further comprising a readout amplifier connected to said at least one reference cell, and a gain of said readout amplifier is modified based upon the refresh signal being supplied thereto.

22. A non-volatile memory according to claim 17, wherein said switching circuit comprises:

a switch having a first state for comparing a signal read from one of said plurality of memory cells and a signal read from said at least one reference cell, and a second state for comparing the signal read from said at least one reference cell and the signal read from said first non-used memory cell; and a comparator having first and second inputs connected to said switching circuit.

* * * * *

UNITED STATES PATENT AND TRADEMARK OFFICE
CERTIFICATE OF CORRECTION

PATENT NO. : 6,754,125 B2
DATED : June 22, 2004
INVENTOR(S) : Fournel et al.

It is certified that error appears in the above-identified patent and that said Letters Patent is hereby corrected as shown below:

Title page,
Item [56], References Cited, FOREIGN PATENT DOCUMENTS, delete "0753869" insert -- 0753959 --

Drawings,
Illustrative Figure, delete FIG. 3 and insert new FIG. 3

Delete Figs. 1, 2, 3, 4, 5, 6 and 7 on Sheets 1-4, and replace with the attached new Sheets 1-4.

Signed and Sealed this

Twelfth Day of October, 2004

JON W. DUDAS
*Director of the United States Patent and Trademark Office*